United States Patent [19]

McLachlan

[11] Patent Number: 5,750,432

[45] Date of Patent: May 12, 1998

[54] DEFECT CONTROL IN FORMATION OF DIELECTRICALLY ISOLATED SEMICONDUCTOR DEVICE REGIONS

[75] Inventor: Craig J. McLachlan, Valkaria, Fla.

[73] Assignee: Harris Corporation, Palm Bay, Fla.

[21] Appl. No.: 481,115

[22] Filed: Jun. 7, 1995

[51] Int. Cl.⁶ .................................................. H01L 21/76
[52] U.S. Cl. ........................... 438/404; 438/406; 438/938
[58] Field of Search ............... 437/62, 67; 148/DIG. 85, 148/DIG. 86

[56] References Cited

U.S. PATENT DOCUMENTS

| | | |
|---|---|---|
| 3,966,577 | 6/1976 | Hochberg . |
| 5,084,408 | 1/1992 | Baba et al. ................................ 437/62 |
| 5,372,952 | 12/1994 | Aronowitz et al. . |
| 5,416,041 | 5/1995 | Schwalke . |

FOREIGN PATENT DOCUMENTS

| | | |
|---|---|---|
| 2-126650 | 5/1990 | European Pat. Off. . |
| 53-148394 | 12/1978 | Japan . |
| 1-302741 | 12/1989 | Japan . |

*Primary Examiner*—George R. Fourson
*Attorney, Agent, or Firm*—Jaeckle Fleischmann & Mugel, LLP

[57] ABSTRACT

Oxygen induced lattice slip defects are reduced in device layer 26 of silicon-on-insulator structure 12, 16, 26. At the bottom of trenches 22 notches 28 are etched into the dielectric layer 16. A thermal oxide process provides protrusions 30 of oxide into the substrate. The protrusions 30 direct defects into the support layer 12.

11 Claims, 2 Drawing Sheets

5,750,432

1

DEFECT CONTROL IN FORMATION OF DIELECTRICALLY ISOLATED SEMICONDUCTOR DEVICE REGIONS

FIELD OF THE INVENTION

The present invention relates to Silicon On Insulator (SOI), or, dielectrically isolated, integrated circuitry and, more particularly, to both manufacturing methods and circuit structures for improving device performance at higher levels of integration.

BACKGROUND AND SUMMARY OF THE INVENTION

Dielectrically isolated integrated circuit structures have long been an isolation architecture of choice for designers of high performance analog circuitry. Specifically, when meeting requirements for high breakdown voltage and noise immunity circuit designers often select dielectric isolation over junction isolation. As levels of integration have advanced, techniques for forming the isolated islands have evolved from combinations of wet etch techniques and epitaxial growth to SIMOX and bonded wafer techniques. Generally, a layer of silicon dioxide, referred to as "bottom oxide," or another electrically insulative material bounds the active device layer. For these latter technologies the formation of device islands usually involves trench formation, e.g., etching a narrow, relatively deep groove from the upper surface of the active layer down to the bottom oxide, followed by refill of the trench region with suitable material for sustaining satisfactory breakdown voltage characteristics between adjacent islands. Depending on trench width, the proximity between devices of adjacent islands and device operating ranges, the fill material may be a combination of thermally grown silicon dioxide, deposited insulator or polysilicon.

One trench isolation process sequence for a bonded wafer begins with a wafer structure having a 3 to 10 micron silicon device layer over a 2 to 3 micron silicon dioxide (bottom oxide) insulator. Silicon dioxide is deposited over the device layer and patterned with photo resist in a conventional manner to provide a mask layer for defining the trench regions. A dry etch, anisotropic and relatively selective to silicon, is applied to extend the trenches through the silicon down to the bottom oxide. The mask layer thickness and selectivity to oxide are chosen to remove most of the mask layer, e.g., up to 1.5 microns. A subsequent deglaze (isotropic wet etch using HF), having as its primary purpose removal of residual material from within the trench, also strips the remaining mask oxide. With the entire exposed device layer prepared, a subsequent thermal oxide growth provides a silicon-oxide interface with low surface state density. The oxide growth may be followed by deposition of more oxide within the trenches to provide desired breakdown voltage thresholds between island regions. If the thermally grown oxide provides sufficient dielectric isolation, the trench may be filled with poysilicon instead of oxide.

One consideration in process design is the trade off between amounts of thermally grown and deposited oxide in that there is an inherent aspect ratio for trench fill relative to the upper surface of the device layer. A trench fill of 1.2 microns along the side wall could result in 2 to 3 microns of deposited oxide on the surface, most of which must be removed, e.g., down to less than 1.5 microns, to facilitate further processing, such as device implants through an oxide mask level.

2

It is known that the trench formation process results in a variety of structural artifacts in portions of the active semiconductor layer adjoining the trench regions. Specifically, during subsequent processing, such as thermal oxide growth, it is known that stress-induced crystal defects are generated about these artifacts. See, for example, U.S. Pat. No. 5,270,265 which provides a means to prevent at least one form of artifact and associated defects resulting from subsequent thermal processing. However, such defects are not always problematic. In fact, when device formation in island regions permits sufficient spacing between the device diffusions and the trench, the defects may be inconsequential. On the other hand, when the defects extend into the device active region significant leakage currents may result, thereby rendering the circuit performance unacceptable and degrading overall wafer yield. In the past it has not been possible to control the lateral extent of crystal faults resulting from these defects and, at best, they are tolerated at the expense of reduced area efficiency or suboptimal device performance.

As an illustration of this problem, see the prior art SOI wafer structure 5 of FIG. 1, wherein trench isolation technology is used to form a plurality of dielectrically isolated semiconductor islands 7 over an insulator (silicon dioxide) layer 9. A semiconductor substrate layer or handle wafer 11 provides structural support. In this example, the trench regions formed between adjacent islands 7 are filled with thermally grown oxide 13 followed by depositing a layer of silicon dioxide or polysilicon 15. The trench fill creates high stress regions, particularly near those portions of the islands where thermal oxide growth in the trench regions adjoins the insulator layer 9. The stresses are believed to result in dislocation-type defects and faults in the lattice structure of the islands (shown by hatch lines along the <1,1,1> planes). The defects may extend into the substrate handle wafer.

As best understood, mechanisms for the above-described faults begin with lateral oxide encroachment under the islands 7 when thermal oxide is grown over the trench walls. Further stresses are created by mismatches in thermal properties of the trench fill material relative to the lattice material. The lateral oxide growth extends from the trench regions along the insulator layer 9 and under the islands, creating initial stresses which result in defect formation. It is a "bird's beak" formation akin to that present in a conventional Local Oxidation Of Silicon (LOCOS) process. This formation either results from, or is magnified in degree by, wet etch processing which creates an undercut artifact along the trench-insulator interface (not shown in FIG. 1). Although there exists at least one process solution to prevent undercut formation (see again U.S. Pat. No. 5,270,265), manufacturing constraints, such as the amount of silicon dioxide that can be formed over and then removed from the active layer, may require a fabrication process which results in the undercut artifact. Of note, even in the absence of the undercut formation, it is a characteristic of thermal oxide growth about a silicon-silicon dioxide interface for there to be oxidation of the silicon along the oxide boundary, thereby creating a bird's beak type stress.

According to the present invention there are provided a process and structure for reducing stress-induced lattice slip of the type observed in device island regions after thermal oxidation along trench regions in a SOI structure. In a general form the invention involves creating lattice slip in an area other than the device island regions which slip reduces oxidation-induced stress in the device island region. In a preferred embodiment a notch is formed in the dielectric layer separating the device island regions from the support layer such that with oxide growth in the trench regions stress build up in the device island regions is limited by occurrence of lattice slip in the support layer. As a result the structure is characterized by a relatively low oxidation defect density in the island regions and a relatively high oxide-induced defect density in the support layer.

DETAILED DESCRIPTION OF THE INVENTION

Figure 1:
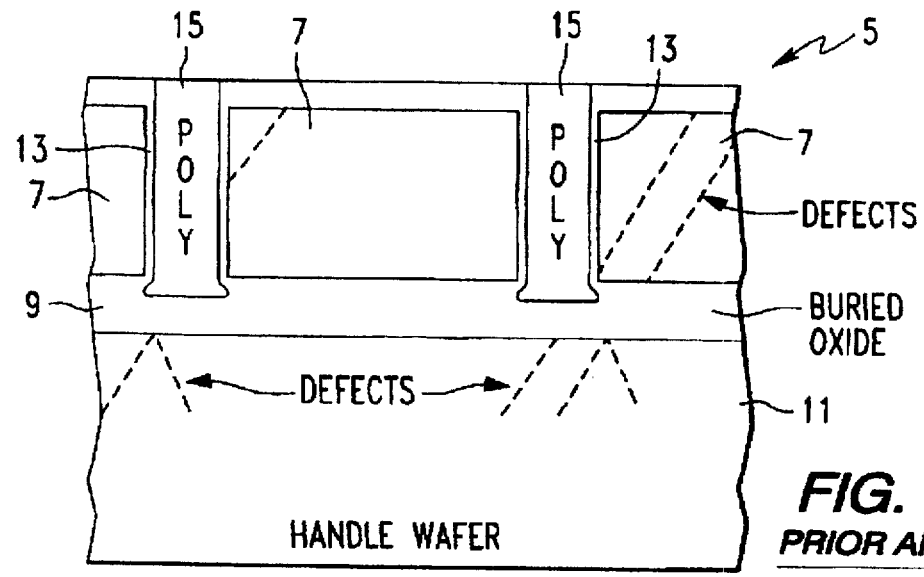
FIG. 1 diagrammatically illustrates a prior art silicon-on-insulator semiconductor structure of the type having high stress regions leading to lattice slip in device island regions.

With reference to FIGS. 2(a–g) there is shown an exemplary fabrication sequence for preparing a dielectrically isolated integrated circuit structure having reduced lattice slip in the island regions. As shown in FIG. 2a the starting material is a bonded wafer structure 10 having a monocrystalline silicon support layer 12, (which, alternately, could be polycrystalline and could comprise other materials generally useful for providing a support member. The strucuture 10 includes an upper layer 14 comprising high quality silicon suitable for device formation thereon and a silicon dioxide layer 16 providing electrical isolation between the support layer 12 and the device layer 14. Although the isolation layer 16 is preferably formed of silicon dioxide, a number of other materials, including silicon nitride and polycrystalline diamond, are known to provide the desired electrical properties. The device layer 14 is on the order of 17–22 microns thick and may be thinned substantially during subsequent processing to maximize switching speed and frequency characteristics of devices. The oxide layer 16 is approximately 2.2 microns thick, but, depending on specific electrical requirements, this will vary.

Figure 2A:
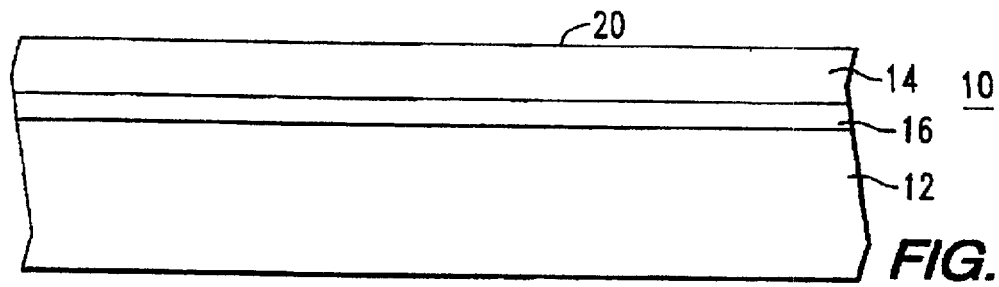
FIGS. 2a–2g illustrate formation of electrically isolated device islands in a semiconductor structure according to the invention.
Figure 2B:
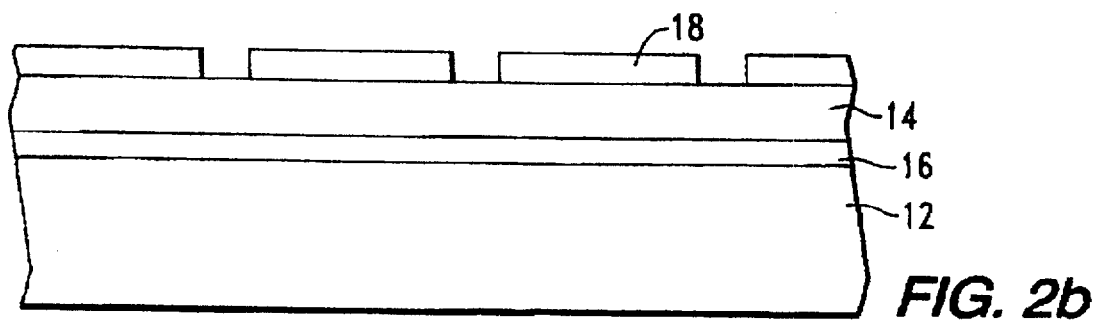
Figure 2C:
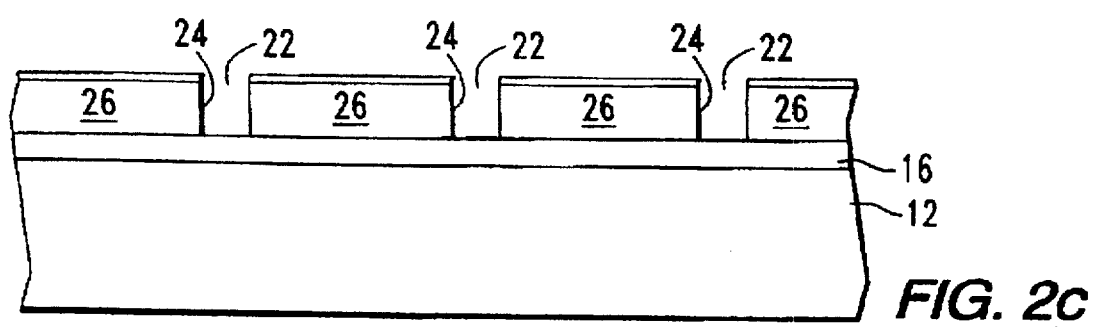
Figure 2D:
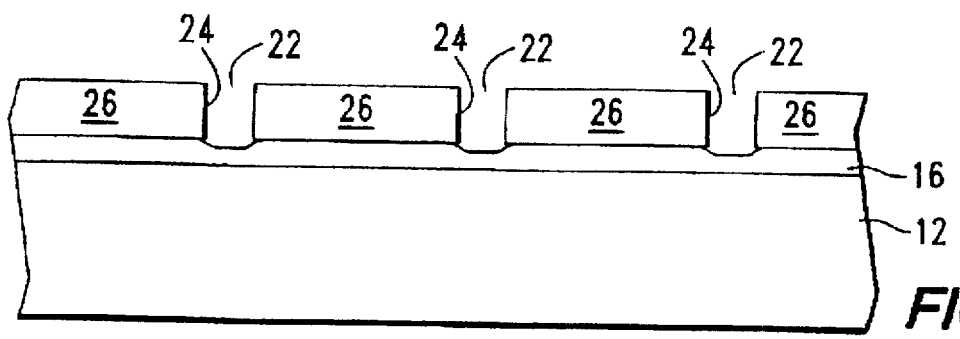

Next a mask layer 18 is provided over the surface 20 of the device layer 14. Although nitride or oxide could be deposited to form the mask layer 18, two microns of silicon dioxide is thermally grown on the device layer surface 20. With conventional photoresist lithography followed by an HF oxide etch the mask layer 18 is patterned to define trench regions over the device layer surface as shown in FIG. 2b. A vertical etch is then applied through the oxide mask to form a matrix of trenches 22 having vertical-like sidewalls 24 which divide the device layer into a plurality of island regions 26. For example, a BCl₃ reactive ion etch (RIE) provides sufficient anisotropicity and selectivity to etch through the device layer 14 and expose the oxide layer 16 while leaving a residual portion, e.g., 6,000 Angstroms, of the mask layer 18 over the device layer 14 (FIG. 2c).

Note, there is often significant variability in the thickness of the device layer 14, e.g., +/–2.5 microns. The etch selectivity (silicon to oxide) is also known to vary. Thus, although the etch may be designed to stop on the oxide layer, the trench etch may incidentally remove some, perhaps 5,000 Angstroms, of the oxide layer 16 in some of the trenches. According to the invention, such oxide removal, although not consistent across a wafer, is at times sufficient to reduce stresses which would otherwise cause lattice slip in the device layer. Theory and mechanism are discussed below in conjunction with the preferred embodiment.

A wet etch (HF solution) is applied to remove the majority of oxide left on the surface 20 and residual byproducts of the trench etch. Other residuals, including polymeric films, are cleaned out with sulfuric acid. The resultant structure, shown in FIG. 2d, includes undercut regions beneath the trench sidewalls, resulting from the isotropic nature of the wet etch.

Normally at this point in the process the trench walls 24 are lined with dielectric material to electrically isolate the island regions 18 from one another. Growth of thermal oxide, alone or in combination with deposition of insulator, assures a low density of surface states and avoids the afore-described deposition aspect ratio considerations.

Figure 2E:
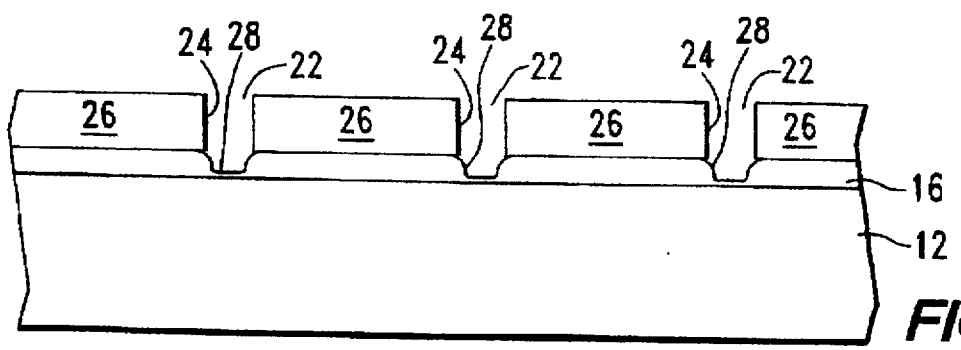
Figure 2F:
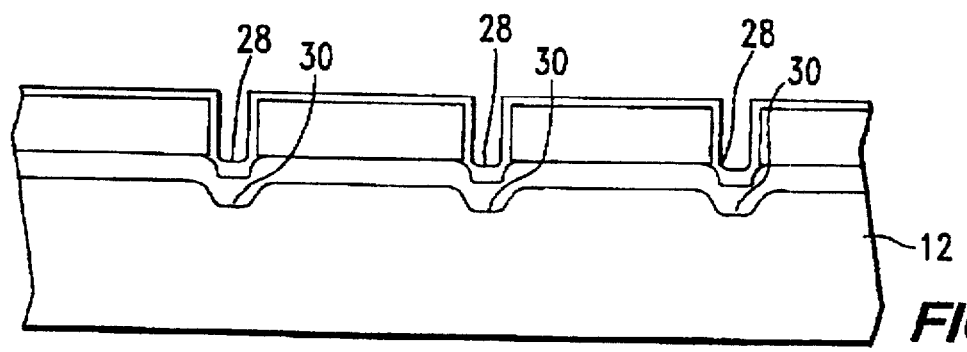
Figure 2G:
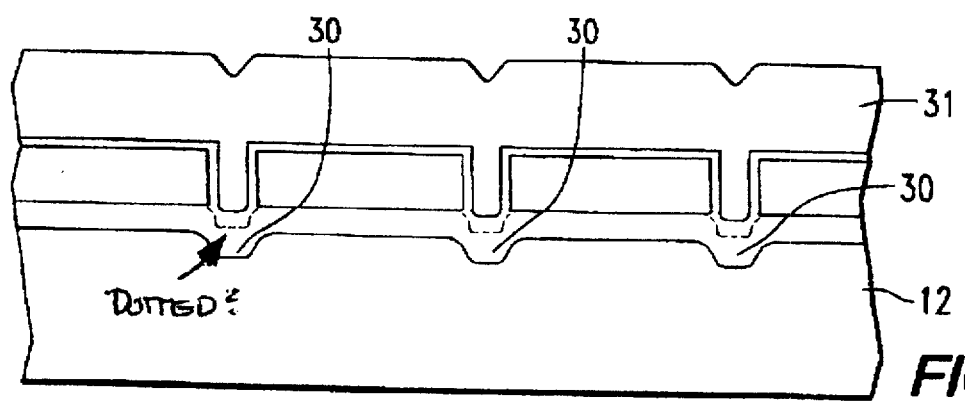

According to the invention, further etching is performed prior to oxide growth in order to mitigate stress-induced lattice slip in the island regions 26 as described above with reference to FIG. 1. In a preferred embodiment a notch or recess is first formed in the oxide layer 16 within the trenches 22 in order to define an area near the island regions 26 for generating other lattice stress during oxidation. For example, the notch structure 28 shown in FIG. 2e is defined by applying a dry oxide etch ($CHF_3/O_2$) to extend the trench structure into the dielectric layer 16. As illustrated in FIG. 2f, subsequent oxide growth (at least one micron thick) over the trench surface 24 both lines the trench with oxide and results in a plurality of oxide perturbations 30 which create the stress regions. The perturbations 30, which result from oxidation of the support layer 12 in the vicinity of the notch structures 26, extend from the notch structures 28, through the dielectric layer 16 into the support layer 12. After the oxide growth the matrix of trenches is filled with polysilicon 31 by Atmospheric Chemical Vapor Deposition (FIG. 2g) the structure is planarized. Device formation then proceeds.

Although not illustrated, the oxidized trench structure of FIG. 2f includes stress regions resulting from bird's beak-like lateral growth of oxide extending from the trench walls 24 along the interface of the dielectric layer and the island regions 26. As noted above, in the past stresses created by such bird's beak formations have caused lattice slip in the adjacent island regions 26. Now, with the introduction of the oxide perturbations, there are a plurality of associated stress points each of which may induce lattice slip in the support layer. To the extent that a bird's beak formation along the interface of the dielectric layer and an island region would, by itself, create sufficient stress to induce a lattice slip in the island region, the oxide perturbation becomes a predominant stress point inducing an alternate lattice slip responsive primarily to stresses generated by the perturbation and also relieving stresses associated with the bird's beak formation.

A feature of the invention is that the stress relieving lattice slip occurs in an area which does not degrade the electrical properties of the island regions 26. In the preferred embodiment the stress-relieving lattice slip occurs in the support layer 12. To the extent lattice slip in the island regions 26 is mitigated, it is believed that stress release resulting from lattice slip in the support layer has reduced the stress about the bird's beak formations.

By forming a notch structure in exposed portions of the dielectric layer prior to oxide growth, lattice slip in the island regions resulting from the oxide growth is mitigated. Preferably, the depth of the trench structure, which would otherwise extend only slightly into the dielectric layer 16 (depending on etch selectivities and nonumiformities in thicknesses of etched materials), is extended a predetermined depth to form a notch which, after thermal growth, creates an oxide perturbation. This structure induces a stress-relieving lattice slip in the support layer and serves to release stress caused by the lateral bird's beak formation.

The resulting wafer structure 10 is characterized by a relatively low oxide-induced defect density in the island regions 26 and a relatively high oxide-induced defect density in the support layer 12 near the dielectric layer 12.

The notch structure 28 has been illustrated as having a cross sectional width, as measured along the interface of the island regions and the dielectric layer, essentially equal to the width of the trench 22 as measured along the same interface. The notch structure is also illustrated as having a tapered cross sectional width as a function of depth. However, the notch structure can be etched in alignment with the trench walls to have a cross sectional width at its deepest point which is commensurate with the cross sectional width as measured along the interface of the island regions and the dielectric layer. This is effected by following the Cl/He high selectivity silicon trench etch of FIG. 2c with an in situ modification of etch chemistry to boron trichloride to alter selectivity to oxide. Further, based on process convenience the notch structure is symmetrically nested within the trenches. This feature is not required to mitigate lattice slip in the island regions 26.

The general consideration for defining a notch which provides stress-relieving lattice slip is as follows. The combination of notch size and shape, i.e., width, depth and curvature, should direct the later oxide growth to generate lattice slips capable of relieving or reducing stresses otherwise created by oxidation along the interface of the island regions 26 and the dielectric layer 12.

An example of specific dimensions known to provide the desired stress relieving lattice slip is as follows. With the dielectric layer 16 at a thickness of about 2 microns and trenches 22 having a cross sectional dimension of 6 microns at the interface of the island regions 26 and the dielectric layer 12: the notch structure 28 has a cross sectional dimension of 4 microns at its deepest extent, and the notch extends about 1.5 microns beneath the interface of the island regions and the dielectric layer.

As noted above, there may be significant variation in the thickness of the device layer across the wafer structure 10, or even across a small matrix of trenches corresponding to the area of an integrated circuit structure. Thus the etch designed for notch formation should assure that the notch extend a minimum depth into the dielectric layer throughout the entire matrix of trenches.

Variations in the embodiments described and the semiconductor structures to which the invention applies will be apparent. For example, in lieu of bonded wafers a variety of other silicon-on-insulator semiconductor structures are applicable. Accordingly, the invention is only to be limited by the claims which follow.

While the method(s) herein described, and the form(s) of apparatus for carrying this (these) method(s) into effect, constitute preferred embodiments of this invention, it is to be understood that the invention is not limited to this (these) precise method(s) and form(s) of apparatus, and that changes may be made in either without departing from the scope of the invention, which is defined in the appended claims.

That which is claimed:

1. A method of forming a silicon-on-insulator (SOI) structure comprising the steps of:

providing a semiconductor structure having a first support layer, a semiconductor layer having an upper portion suitable for device formation and a dielectric layer formed between the support layer and the semiconductor layer;

forming the semiconductor layer into a plurality of spaced apart island regions by patterning and etching a trench structure through the upper portions to expose a portion of the dielectric layer, said trench structure defined by sidewalls spaced apart a uniform distance over a major portion of the depth of the trench;

anisotropically etching the dielectric layer to remove only some of the dielectric layer to form notches in the exposed portion of the dielectric layer for translating stress-relieving lattice slip to the dielectric layer;

tapering the notches to reduce their cross sectional notch width as the notches penetrate the dielectric layer; and forming at least one micron of thick thermal oxide along the trench structure, the resulting structure having portions of dielectric material protruding into the support layer and thus forming an SOI structure characterized by a relatively low oxidation-induced defect density in the island regions and a relatively high oxidation-induced defect density in the support layer.

2. The method of claim 1 wherein the step of etching the trench structure to expose the dielectric layer results in a first cross sectional trench width along the dielectric layer and the notches are formed in the dielectrical layer and the anisotropic etch results in a major portion of the depth of the notches having a maximum cross sectional notch width no greater than the controlled distance between the sidewalls of the major portion of the trench.

3. The method of claim 1 wherein the notch is formed within the cross sectional confines of the trench and in self alignment with the trench structure.

4. A method of forming a silicon-on-insulator integrated circuit structure comprising the steps of:

providing a semiconductor structure having a first crystalline support layer, a semiconductor layer having an upper portion suitable for device formation and a dielectric layer formed between the support layer and the semiconductor layer;

forming the semiconductor layer into a plurality of spaced apart island regions by patterning and etching a matrix of trenches through the upper portion to expose the dielectric layer, said trenches each defined by sidewalls spaced apart a uniform distance over a major portion of the depth of each trench;

anisotropically etching the dielectric layer to remove only some of the dielectric layer to form notch structures in the exposed portion of the dielectric layer to mitigate lattice slip in the island regions;

tapering the notch structures to reduce their cross sectional notch width as the notches penetrates the dielectric layer;

thermally oxidizing a portion of the substrate to protrude dielectric material into the substrate to generate stress points where oxidation induced defects are directed into the substrate.

5. The method of claim 4 wherein the notch structures are formed by applying a dry anisotropic oxide etch to extend the trenches into the dielectric layer.

6. The method of claim 4 wherein the notch structures are symmetrically nested within the trenches with a major portion of the depth of the notches having a maximum cross sectional dimension less than the cross sectional dimension of the uniform distance between the sidewalls over the major portion of the depth of the trenches.

7. The method of claim 4 wherein the island regions have non-uniform thickness and the notches are of non-uniform depth into the dielectric layer.

8. The method of claim 4 wherein the matrix of trenches defines an area within an integrated circuit structure.

9. The method of claim 7 wherein the matrix of trenches defines an area over which multiple integrated circuits are fabricated.

10. The method of claim 4, wherein:

the dielectric layer has a thickness of 2 microns;

the trenches have a cross sectional dimension of 6 microns at the interface of the island regions and the dielectric layer;

the notches have a cross sectional dimension of 4 microns measured along said interface; and the notch extends 1.5 microns beyond said interface into the dielectric layer.

11. A method of forming a silicon-on-insulator integrated circuit structure comprising the steps of:

providing a semiconductor structure having a first crystalline support layer, a semiconductor layer having an upper portion suitable for device formation and a dielectric layer formed between the support layer and the semiconductor layer;

forming the semiconductor layer into a plurality of spaced apart regions of device islands by patterning and etching a matrix of trenches through the upper portion to expose the dielectric layer;

removing only a portion of the exposed dielectric layer; and thermally oxidizing the dielectric layer to create a stress point protruding from the dielectric layer into the substrate, said stress point causing lattice slip in a region other than a device island to reduce lattice slip in the island regions when lattice stress is induced by growth of oxide at the interface of the dielectric layer and the island region.

* * * * *